United States Patent [19]

Kimberling

[11] 4,332,773

[45] Jun. 1, 1982

[54] APPARATUS FOR GROWING CRYSTALS

[76] Inventor: Delmer H. Kimberling, 10322 Schnapf La., Newburgh, Ind. 47630

[21] Appl. No.: 184,336

[22] Filed: Sep. 5, 1980

[51] Int. Cl.³ .......................................... B01D 91/02
[52] U.S. Cl. .................................... 422/109; 422/245
[58] Field of Search ........... 203/DIG. 2; 159/DIG. 1, 159/45, DIG. 38; 202/83, 235; 156/601, 623 Q, 623 R; 219/327, 328, 331, 494; 23/301; 422/245, 109

[56] References Cited

U.S. PATENT DOCUMENTS

| 2,047,252 | 7/1936 | Bloomenthal | 156/623 R |
| 2,266,254 | 12/1941 | Osterheld | 219/328 |
| 2,428,525 | 10/1947 | Osterheld | 219/328 |
| 2,537,093 | 1/1951 | Friedman et al. | 156/623 Q |
| 2,589,310 | 3/1952 | Tournier | 159/49 |
| 2,863,740 | 12/1958 | Christensen | 156/623 R |
| 3,306,829 | 2/1967 | Patterson et al. | 203/DIG. 2 |

FOREIGN PATENT DOCUMENTS 930077 1/1948 France .............. 156/623 R

OTHER PUBLICATIONS

Crystal Growth 2nd Ed., Pamplin Pergamon Press, N.Y., 1980.

Primary Examiner—Hiram Bernstein
Attorney, Agent, or Firm—Harvey B. Jacobson

[57] ABSTRACT

A crystal growing apparatus primarily for use by hobbyists and for classroom instruction comprises a container for holding a solute and aqueous solvent, a heat source in the form of a light bulb placed at the base of said container and spaced from the center thereof, a motor placed at the top of the container and having an associated rotating shaft, a filament for holding the crystal in the aqueous solvent-solute mixture, a fastening means for holding said filament coaxial with the motor shaft and enabling the filament to be vertically adjusted with respect to the aqueous mixture and a thermostat connected with the motor and light bulb to accurately control evaporation of the solvent and movement of the solute back and forth from the dissolved-to-crystal-line state by means of the thermal current set up by the off-centered heat source and intermittent operation of the heat source and motor. The crystal growing device is relatively simple in construction yet enables the formation of large single crystals of a wide variety of substances and is so constructed so as to be most useful by crystal growing hobbyists and students studying this chemical phenomenon.

7 Claims, 5 Drawing Figures

APPARATUS FOR GROWING CRYSTALS

FIELD OF THE INVENTION

This invention relates to crystal growing apparatus and a method of growing crystals using same. More particularly, the invention relates to a crystal growing apparatus which has utility for hobbyists and students in that the crystal growing apparatus of the present invention is relatively simple in construction and is adjustable to accommodate various types and amounts of solutes for producing large crystals from many types of inorganic and organic materials.

In general, crystals are grown by immersing a crystal nucleus in a saturated solution of the crystalline substance and either gradually reducing the temperature of the solution or gradually evaporating the solvent from the solution over an extended period of time.

It is possible to grow large and nearly perfect crystals from water solutions of a wide variety of substances. Examples of substances which can be easily grown from water solutions are copper sulphate, aluminum potassium sulphate and similar sulphates and complexes of cobalt, nickel, chromium and other metals. In addition, there are many organic compounds which can be grown from water solutions such as sodium potassium tartrate which produces piezo electric crystals used in electronic equipment for frequency control. For the hobbyist, growing crystals from water solutions provides an inexpensive manner of experimenting with a chemical phenomenon which can produce striking and beautiful decorative crystals and at the same time witness and gain understanding of this chemical process. While certain types of crystals have a distinctive crystal shape and color, it is also possible to mix different colors of the same crystal type or mix different crystal types to produce color blends and variations in crystal shape. The possibilities of producing varied types of decorative crystals are practically unlimited, thus enhancing crystal growing as a hobby.

Although the process of growing crystals is based on the principles of chemistry and physics, growing large crystals of a variety of chemicals approaches an art in the same sense as cooking or gardening. For the hobbyist or classroom instructor, therefore, a crystal growing apparatus should be adjustable to permit changes in operating parameters simply and inexpensively. With such an apparatus as disclosed in the present invention and the convenient use of handbooks of chemistry to avoid dangerous chemicals and examine the possibilities of growing crystals of different types and colors as well as combinations, the hobbyist or classroom instructor can grow a large variety of crystals at minimum expense.

DISCLOSURE STATEMENT

Apparatus for growing crystals are available primarily for industrial applications. For example, the semiconductor industry makes extensive use of growing single crystals of semi-conducting materials such as silicon. Many patents have issued on crystal growing apparatus or processes for growing specific crystal types. For example, U.S. Pat. No. 2,571,651, issued Oct. 16, 1951 to Balduzzi discloses a crystal growing apparatus in which accurate control of the saturated solution temperature containing a crystal is the primary object of the invention. While no doubt the heating arrangement of this patent produces the intended results, such a temperature control system is much too complex to be useful by the hobbyist or classroom instructor who is typically limited to restricted budgets. Likewise, U.S. Pat. No. 2,793,941, to Estes discloses an apparatus for growing crystals from an enclosed solution of a material that has a nearly flat or negative or slightly positive slope solubility curve. The patent discloses growing crystals of lithium sulphate monohydrate. As in the Balduzzi patent, Estes discloses a very expensive and elaborate apparatus for growing clear and flawless crystals from a narrow range of materials primarily for industrial use. Because of their expense and single purpose design, neither of the crystal growing apparatus of these patents can be readily used by a hobbyist or for instructional purposes in the classroom. The crystal growing apparatus of the present invention not only includes design features which make it suitable for growing crystals as a hobby or for demonstrating the principles of crystallization in a classroom, but includes features which have not been utilized in industrial crystal growing apparatus.

SUMMARY OF THE INVENTION

In accordance with the present invention, a crystal growing apparatus is provided which has the necessary versatility needed by hobbyists and classroom instructors to experiment and grow a large variety of water-soluble crystals. The apparatus is not limited to a narrow class of crystals that can be grown. Further, the crystal growing apparatus of the present invention can be produced and operated at minimal expense commensurate with the oftentimes limited budget of hobbyists and learning institutions.

The crystal growing apparatus comprises a container for holding water and the water-soluble solute which is to be crystallized in a manner known in the art from a saturated solution of the solute. A motor containing a rotatable shaft which supports a filament holding the growing crystal operates to rotate the crystal as it grows in the saturated solution. An external heat source is placed adjacent the bottom of the container to provide the evaporation of the aqueous solvent. A thermal system consisting of the heat source and a thermostat mounted on a heat conducting flange placed in contact with the bottom portion of the container provides accurate control of the temperature of the solution and operation of the heat source and motor.

Several unique features of the crystal growing apparatus of the present invention make it more suitable for use by hobbyists and in the classroom than the more sophisticated and specialized industrial crystal forming devices. The filament supporting the growing crystal is fastened coaxially onto the motor shaft by a pair of elastic bands enabling the easy adjustment of the crystal position with respect to the solute positioned on the bottom of the container. More importantly to the hobbyist or classroom instructor, the adjustment and coaxial arrangement of the crystal-supporting filament makes it possible to grow a maximum sized crystal in a minimum of solution and size of container without sacrificing the advantages of the seed crystal traveling in a larce circle during the beginning stages of growing. Typically, crystal growing devices for industrial purposes employ a horizontal member attached to the central motor shaft to accomplish support and rotation of the growing crystal. Such horizontal members are not adjustable and therefore require a correspondingly larger container and significantly more solution than is required by the versatile crystal growing apparatus of the present invention in which the filament supporting the crystal is coaxially arranged on the motor shaft and can be adjusted along its length relative to the saturated solution. Another unique feature of the crystal growing apparatus of the present invention is the type of heat source which is utilized to provide controlled evaporation of the water solvent and the location of the heat source adjacent the bottom of the container. Most rotary crystallizers use a swirling effect to bring the solute to be dissolved over the heat source placed centrally under the bottom of the crystal growing container. The heat source of the present invention is located to one side of the container adjacent the bottom so as to produce convectional currents across the bottom portion of the container. The moving crystal interrupts these currents and produces conditions favorable to crystal growth. This arrangement makes it possible to control both the relative direction and intensity of the convection currents by purposeful rotation of the container with respect to the heat source and thus allows considerable amount of control over the growth rate of the crystal. A preferred heat source utilized is an electric light which besides producing the advantageous thermal convective currents in the solution enables the growing crystal to be visualized. This is advantageous for the hobbyist and for classroom observation since instruction is important for enjoyment and learning. Many solutions used are so dense that the growing crystal is not visible.

The process of growing large, primarily decorative crystals in the crystal growing apparatus of the present invention involves the use of a stirring device comprising a thin rectangular paddle suspended on a plastic filament which is fastened coaxially to the rotating shaft of the motor. The rotation of the paddle in the saturated solution is used to produce the equilibrium condition which is necessary before introducing the seed crystal. Once equilibrium conditions have been generated by the rotating paddle, the seed crystal, secured onto the end of a filament line, replaces the stirring device and crystallization proceeds under the control of the thermostat which allows only the intermittent rotating of the crystal in the solution and intermittent heating of the solution to maintain a uniform solution temperature throughout, providing successful and controlled crystal growth.

A primary object of the present invention is to provide a crystal growing apparatus which is designed to be utilized by hobbyists and for classroom instruction.

Another object of the present invention is to provide a crystal growing apparatus which is relatively inexpensive and will allow the formation of many types and shapes of crystals from a wide variety of solute materials.

Another object of the present invention is to provide a crystal growing apparatus with such versatility that it can be used and enjoyed by the hobbyist learning the art of crystal growing and for classroom instruction enabling the necessary experimentation and observation for understanding the crystallization process.

Still another object of the present invention is to provide a crystal growing apparatus in which thermal conductive currents can be formed in the crystal growing solution by means of a heat source enabling the control of crystal growth within the solution.

Still yet another object of the present invention is to provide a process for growing crystals in which equilibrium conditions are generated in a saturated water solution of solute before crystal growth is to proceed by the addition of a seed crystal into the saturated solution.

Another object of the present invention is to provide a crystal growing apparatus with a thermal system which allows for controlled evaporation of water solvent and is able to maintain a constant solution temperature necessary for crystal growth.

These together with other objects and advantages which will become subsequently apparent reside in the details of construction and operation as more fully hereinafter described and claimed, reference being had to the accompanying drawings forming a part hereof, wherein like numerals refer to like parts throughout.

DETAILED DESCRIPTION OF THE INVENTION

Figure 1:
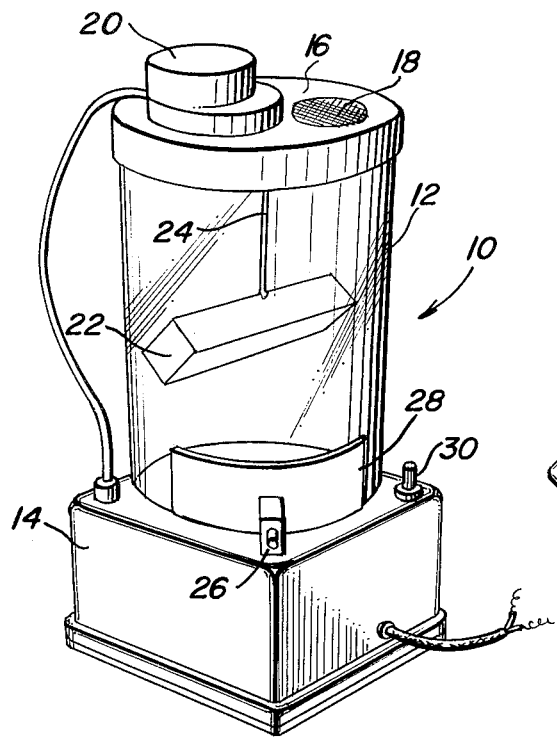
FIG. 1 is a perspective view of the crystal growing apparatus of the present invention containing a growing crystal situated in the crystal growing solution.

Referring to FIG. 1, the crystal growing apparatus indicated generally by reference numeral 10 includes a transparent container 12 in which is placed the solution of water solvent and water-soluble solute and which is supported on a sturdy but lightweight base 14 formed of plastic or lightweight metal or wood. Container 12 is enclosed by a lid 16 containing a screened opening 18 to allow evaporation of the solvent and thus produce a constant crystal growth tendency. The screened opening 18 is particularly useful when growing crystals from substances having a very low solubility vs. temperature coefficient or are only sparingly or slightly soluble in water. Also, screened opening 18 allows easy inspection from the top of crystal growing apparatus 10 without removing lid 16. Lid 16 supports an electric motor 20 used for rotation of the growing crystal indicated by reference numeral 22 which is supported for rotation by a filament 24. Placed in contact with the exterior of container 12 at the bottom thereof is thermostat 26 and heat sensing flange 28 formed of a heat-conducting metal and which maintain a constant saturated solution temperature and provide the intermittent operation of motor 20 and the heat source of the crystal grower. On-off switch 30 activates thermostat 26 for operation of motor 20 and the heat source in a manner which enables the controlled growth of a crystal as will be explained later.

Figure 3:
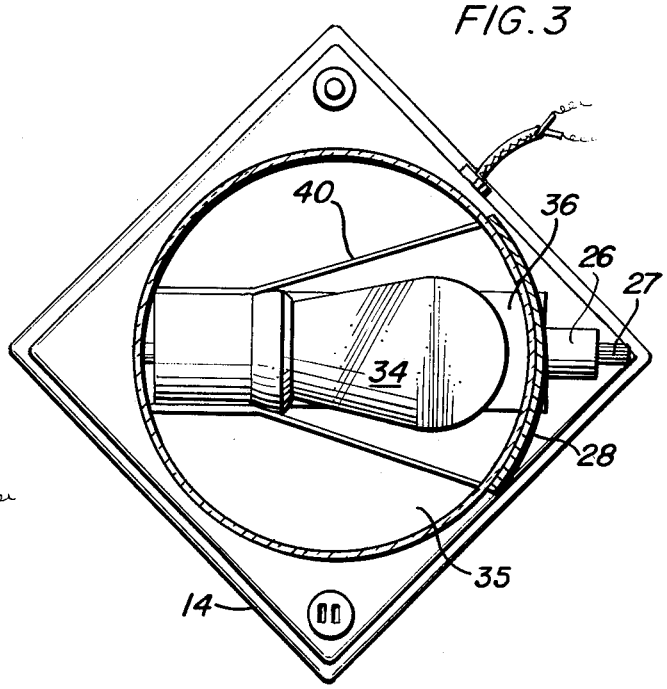
FIG. 3 is a transverse sectional view of the crystal growing apparatus taken generally along line 3—3 of FIG. 2 and illustrating the placement of the heat source.
Figure 2:
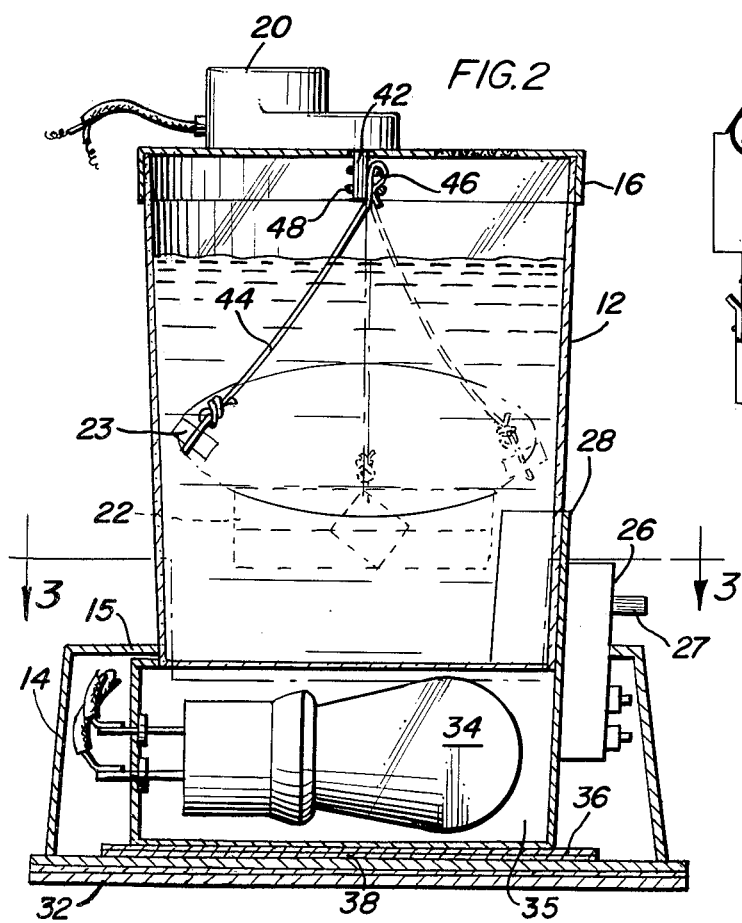
FIG. 2 is a longitudinal sectional view of the crystal growing apparatus of FIG. 1 in which the crystal growing process is shown in two forms, the beginning of crystal growth in which the crystal rotates about a wide path through the solution and a crystal nearing the end of its growth period which is large as shown in phantom and rotates substantially about its central axis.

FIGS. 2 and 3 illustrate several of the unique features of crystal growing apparatus 10 which make it useful for the hobbyist and for classroom instruction and which distinguish the crystal growing apparatus of the present invention from prior art devices. Container 12 can be seen fitted within base 14 and is situated thereon to be securely held by overlapping portion 15. Container 12 can be rotated by hand on base 14 which enables control of crystal growth as described below. Container 12 is preferably tall to hold a reserve of solution so that the hazardous operation of adding saturated solution during the crystal growing process which may dissolve, disfigure or fracture the growing crystal is avoided.

As can be seen in FIG. 2, base 14 is hollow and includes a removable bottom 32 to incorporate a heat source for the purpose of evaporating the water solvent. The heat source of crystal growing apparatus 10 is a light bulb 34 which is positioned within hollow space 35 of base 14. In order for crystal growth to proceed, it is important that the solution temperature be maintained substantially constant throughout crystal growth. The thermal system of the present invention for maintaining any temperature fluctuations within very narrow limits includes light bulb 34, thermostat 26 and heat exchange flange 28, all of which are placed in a tightly coupled arrangement. Heat conducting flange 28 contacts heat conducting strip 36 placed below light bulb 34. An asbestos sheet 38 protects base 14 and the surface upon which base 14 is situated from the heat produced by light bulb 34. Light bulb 34 is situated within a metallic frame 40 which secures light bulb 34 firmly in place.

The placement of light bulb 34 adjacent the bottom of container 12 so that the maximum heat producing area is off the center of container 12 represents a unique and advantageous feature of crystal growing apparatus 10. Typically, rotary crystallizers utilize a swirling effect such as by the addition of a separate agitating member to bring the solute to be dissolved over the heat source placed under the center of the bottom of the container which holds the solution. By locating light bulb 34 off-center of container 12, heat convectional currents are produced across the bottom portion of container 10. It is now possible to control both the relative direction and intensity of these currents by purposeful rotation of container 12 with respect to the heat source thereby allowing favorable control over the growth rate of the crystal. Moreover, the rotation of the crystal interrupts the convectional currents and produces conditions favorable to crystal growth. The use of light bulb 34 as a heat source has another advantage in that many solutions used by hobbyists and classroom instructors are so dense that the crystal is not visible unless a strong light is used for inspection. Since for a hobbyist and for classroom instruction the need exists for observation, the use of a light bulb 34 as the heat source enables the needed observation of crystal growth and likewise eliminates the need for a separate light source. Light bulb 34 placed outside and adjacent the bottom of container 12 has a further advantage in that the top of the container 12 including lid 16 is at a lower temperature and thus evaporated water condenses on lid 16 and portions of container 10 above the level of the solution. The condensed water runs down and dilutes the top layers of the solution preventing the formation of floating crystals which may drop down and damage the growing crystal situated in the solution.

Another feature of crystal growing apparatus 10 which adds versatility is the means by which the crystal is supported for rotation in the solution. The crystal is supported to motor shaft 42 by means of a plastic filament 44 such as a fish line. Filament 44 can be replaced with a heavier rod structure. Filament 44 is fastened co-axially or substantially so onto drive shaft 42 of motor 20. The placement of filament 44 onto the outer surface of drive shaft 42 allows the crystal to travel in a large circle during the beginning stages of growth such as shown by crystal 23 in FIG. 2. As the crystal grows it eventually revolves around its central axis as shown by crystal 22. The arrangement makes it possible to grow a large crystal in a relatively small container containing a minimum of solution. The means by which filament 44 is attached to drive shaft 42 greatly enhances the versatility of crystal growing apparatus 10 as a device which can be used by hobbyists and for classroom instruction. Filament 44 is threaded through a pair of O-rings 46 and 48 which are fastened around drive shaft 42. O-rings 46 and 48 are preferably elastic bands. Preferably, filament 44 is slipped through O-rings 46 and 48 and folded utilizing O-ring 48 as a clamp over the loose end of filament 44, pressing filament 44 against drive shaft 42. The use of the O-rings allows the easy adjustment of the crystal position with respect to the solute accumulated at the bottom of container 10. More importantly, the easy adjustment of filament 44 and flexibility of filament 44 make it possible to grow a maximum size crystal in a minimum of solution and minimum size of container without sacrificing the advantages obtained when the seed crystal can travel in a large circle during the beginning of crystal growth. This added versatility minimizes the cost of crystal growing apparatus 10 and yet maximizes the amount of experimentation which can be performed, both advantages important to the hobbyist and for understanding crystal growth as in a classroom setting. Typically, crystal growing devices employ a horizontal member attached to the central motor shaft to accomplish rotation of the crystal in the solution. This horizontal member is not adjustable and therefore requires a correspondingly larger container and more solution than is required by the crystal growing apparatus 10 of the present invention. The prior mentioned patents to Balduzzi and Estes are examples of rotating crystals utilizing a horizontal member for support to the motor drive shaft.

Figure 5:
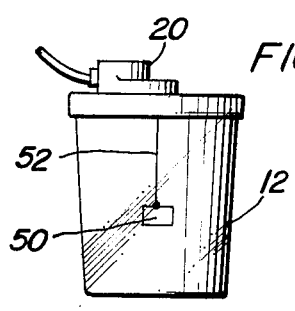
FIG. 5 is a side elevational view of the container of the crystal growing apparatus containing therein the paddle utilized to generate equilibrium conditions within the saturated solution before addition of the seed crystal.

As shown in FIG. 5, a stirring device comprising a thin rectangular paddle 50 is suspended on a plastic filament 52 which is fastened to the drive shaft 42 of motor 20 in the same fashion as filament 44. The purpose of the stirring device is to bring the solution to the proper equilibrium state before introducing the seed crystal. Paddle 50 closely simulates the conditions of equilibrium within the crystal growing solution.

Figure 4:
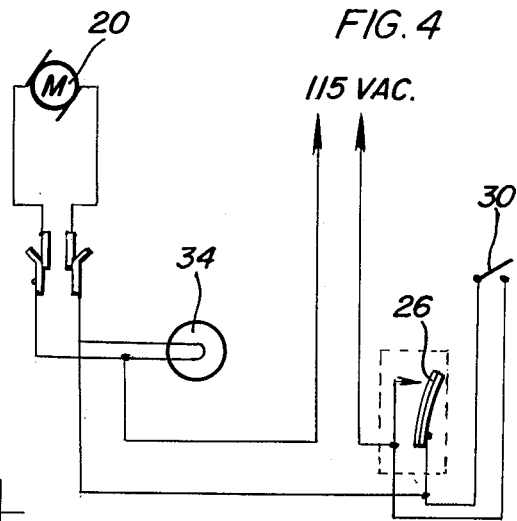
FIG. 4 is a schematic electrical diagram of the crystal growing apparatus of the present invention showing the relationship between the motor, heat source and thermostat.

The operation of growing crystals in crystal growing apparatus 10 is controlled by the thermal system in which motor 20 and the heat source such as light bulb 34 are connected in parallel with thermostat 26 as can be seen in FIG. 4. Accordingly, both the application of heat and the rotation of the crystal in the solution are intermittent operations in relatively rapid on-and-off cycles enabling the solution to be maintained at a constant temperature and enabling the formation of favorable crystal growing conditions within the solution contained in container 12. The previously mentioned tightly coupled arrangement of the thermal system in which the heat source is in close proximity to the thermostat 26 via heat conducting strip 36 and heat conducting flange 28 and the external exposure of the thermostat and heat conducting flange 28 causes the rapid cycling of the system and enables the thermal system to be extremely sensitive to internal and external changes of temperature. While other thermostat systems may be utilized to control solution temperature, the thermal system of the present invention is suitable for hobbyists and classroom instruction because of its minimum expense and simplicity over more complex systems of temperature control disclosed in industrial applications. Moreover, it was found that the solution temperature can be made to respond inversely or directly to ambient temperature change by altering the amount of heat conducting flange 28 which is exposed above base 14. Accordingly, the opportune height and shape for heat conducting flange 28 can be found by experimentation to control the temperature of the crystal growing solution for various sizes and shapes of containers and for different types of solute materials.

OPERATION

While of course handbooks of chemistry should be consulted by any hobbyist or classroom instructor, to minimize expense, a simple test should be made on a small amount of a proposed solution to see if a large single crystal can be grown from that particular solute. The test comprises pouring a small amount of saturated solution into a shallow dish and letting the solution evaporate. If distinct crystals of 2 mm. size or over are formed, the possibility is good that large crystals can be grown, although the results are not conclusive. If larger individual crystals can be obtained by isolating two or three crystals on the bottom of the dish and if by allowing further evaporation the crystals continue to grow in a characteristic shape, the possibility that a large single crystal can be grown is worth pursuing. The crystals formed from any test may well be used as seed crystals in the crystal growing apparatus. Further, a seed crystal should be removed from the solution and allowed to be exposed to the air for a week or more to be sure it is stable. Some crystals may take on water or even dehydrate and deteriorate making them unsuitable for growing into larger crystals unless encapsulated immediately after growing. While some unusual crystals may be grown from impure substances, in general the best crystals are grown from reagent grade chemicals and distilled water. After a solute material has been chosen and several seed crystals have been grown and stabilized, the operation of growing large crystals can commence. The following steps are listed in order to understand the operation of crystal growing apparatus 10.

(1) A place to set crystal growing apparatus 10 out of drafts and direct sunlight should be found. Container 12 is filled about one-quarter full of solute from which material the crystal is to be grown. Distilled water is added until container 12 is about half full.

(2) Lid 16 is placed on container 12 and motor 20 (60 rpm) is inserted into an ordinary electrical socket. Paddle 50, such as a "Teflon" stirrer formed on filament 52, is secured to drive shaft 42 of motor 20 so that paddle 50 just clears the solute. Adjustment of filament 52 can be readily accomplished by slipping the filament up or down between drive shaft 42 and O-rings 46 and 48.

(3) Adjusting screw 27 of thermostat 26 is turned until light 34 goes on and motor 20 starts. Light 34 shortly turns off at which time the thermostat is adjusted so that the light remains off for about one minute providing and on-off cycle of about two minutes.

(4) Water or solute is added as required until the solution is saturated and reaches to within about 2 centimeters of the top of container 12. Solute should be kept heaped over light 34 in a portion of the bottom of container 12 adjacent the thermostat. An excess of solute is to be avoided. The setting of thermostat 26 should be again checked until the on-and-off cycle of two minutes is attained. While this adjustment is not critical, it should not be changed during the period of growth of the crystal.

(5) Distinct crystals eventually form on the sides of container 12 or paddle 50. About two or three days or even longer is needed for the formation of the crystals, the formation of the crystals indicating the time for introduction of the seed crystal.

(6) The seed crystal is tied onto about 20 centimeters of filament 44 by utilizing a half-hitch and paddle 50 and filament 52 are replaced with the seed crystal suspended on the length of filament 44. Filament 44 is secured to drive shaft 42 in the same manner as filament 52 was attached.

(7) The seed crystal is adjusted so that it swings about 2 centimeters above the undissolved solute. Since crystals vary greatly in their optimum positioning, the distance that the crystal suspends from the solute needs to be readjusted as the crystal grows. A good indication of the position for optimum results is the area of densist crystal growth on the side of container 12.

(8) Crystals which form on the sides of container 12 should be removed by means of a spoon or the like so that they fall to the bottom of container 12. Solute can be added or removed, if necessary, to keep a small amount of solute heaped over the heat source on a portion of the bottom of container 12 next to thermostat 26. However, since solute is continually being dissolved over the heat source and deposited elsewhere on the bottom of container 12, this can generally be accomplished by rotating container 12 with respect to base 14. The removal of the growing crystal from the solution should be avoided as much as possible.

(9) Some crystals are subject to fracture due to thermal shock during the growing period. Until the crystals have stabilized at ambient temperatures, they should never be placed on a cold surface or allowed to cool and suddenly be returned to the warm solution. It is best to grow crystals in solutions no more than 2° or 3° C. above the highest anticipated ambient temperature. In general the thermostat adjustment suggested above will take care of this factor.

(10) When the crystal has grown so large that it seems that the crystal is likely to hit the sides of the container 12, it should be removed and dried lightly with a soft tissue or cloth. As stated above, the crystal should not be subjected to any drastic changes in temperatures until it has been stabilized at room temperature.

Since crystal growing apparatus 10 uses both evaporation and thermal conductive currents simultaneously to promote crystal growth, it is possible to grow a wide variety of water-soluble crystals and is not restricted as highly specialized apparatus may be. This versatility is a necessity for the hobbyist or classroom instructor who wishes to experiment and expects to grow every type and kind of crystal possible.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as new is as follows:

1. An apparatus for growing crystals primarily for use by hobbyists and for classroom instruction comprising: a container for holding a mixture of solvent and solute, means to rotate a crystal in said solution, a heat source placed exterior of said container and off-center and adjacent to the bottom of said container, and temperature control means placed exterior of said container to maintain the temperature of the solution relatively constant during the period of growth of said crystal, said rotating means comprising a motor containing a drive shaft and a flexible elongated crystal support means secured to the exterior of said drive shaft for holding and maintaining the crystal within the solution, the longitudinal axis of said crystal support means being substantially parallel to said drive shaft, said crystal support means being adjustably attached to said drive shaft whereby the placement of said crystal in said solution can be vertically adjusted during the growth of the crystal, said heat source being an electric light bulb and said container being transparent whereby the crystal growing in said solution can be observed regardless of the density of the solution.

2. The apparatus of claim 1 wherein said crystal support means is a filament and is adjustably attached to said drive shaft by being secured to said drive shaft by an O-ring which presses said filament to said shaft.

3. The apparatus of claim 1 wherein said temperature control means comprises a heat conducting flange placed in contact with the outer surface of said container and positioned adjacent the bottom of said container and a thermostat placed in contact with said flange, said flange being positioned adjacent said heat source.

4. The apparatus of claim 3 further including a base on which said container is situated, said base being hollow and containing said heat source positioned underneath said container, a portion of said flange being below the surface of said base and adjacent said heat source and another portion of said flange being placed above said base and in contact with said container.

5. The apparatus of claim 4 wherein said rotating means and said heat source are electrically connected in parallel to said thermostat whereby said means to rotate the crystal and said heat source operate simultaneously and intermittently.

6. The apparatus of claim 1 wherein said means to rotate said crystal is an electric motor, said container containing a lid placed on the top of said container and which supports said motor, said lid further containing a screened opening enabling a portion of the solvent to evaporate into the surrounding atmosphere.

7. An apparatus for growing crystals comprising: a container for holding a mixture of solvent and solute, means to rotate a crystal in said solution, a heat source place exterior of said container, and temperature control means placed exterior of said container to maintain the temperature of the solution relatively constant during the period of growth of said crystal, said temperature control means comprising a heat conducting flange placed in contact with the outer surface of said container and positioned adjacent the bottom of said container and a thermostat placed in contact with said flange, said apparatus further including a base on which said container is situated, said base being hollow and containing said heat source positioned underneath said container and off-center the bottom of said container, a portion of said flange being below the surface of said base and adjacent said heat source and another portion of said flange being placed above said base and in contact with said container, said rotating means and said heat source being electrically connected in parallel to said temperature control means whereby said means to rotate the crystal and said heat source operate simultaneously and intermittently, said heat source being an electric light bulb and said container being transparent whereby the crystal growing in said solution can be observed regardless of the density of the solution.

* * * * *